United States Patent
Hueting et al.

(10) Patent No.: US 6,559,502 B2
(45) Date of Patent: May 6, 2003

(54) SEMICONDUCTOR DEVICE

(75) Inventors: Raymond J. E. Hueting, Helmond (NL); Erwin A. Hijzen, Blanden (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/860,311

(22) Filed: May 18, 2001

(65) Prior Publication Data

US 2001/0045578 A1 Nov. 29, 2001

(30) Foreign Application Priority Data

May 20, 2000 (GB) .............................. 0012137

(51) Int. Cl.$^7$ .............................. H01L 29/76
(52) U.S. Cl. .............. 257/331; 257/339; 257/342; 257/343
(58) Field of Search .................. 257/330, 331, 257/332, 336, 339, 342, 343, 409; 438/270, 279

(56) References Cited

U.S. PATENT DOCUMENTS

| | | | |
|---|---|---|---|
| 4,574,310 A | 3/1986 | Nishizawa et al. | 348/307 |
| 4,754,310 A | 6/1988 | Coe | 257/287 |
| 4,835,584 A | 5/1989 | Lancaster | 257/330 |
| 5,216,275 A * | 6/1993 | Chen | 257/493 |
| 5,294,824 A * | 3/1994 | Okada | 257/409 |
| 5,438,215 A | 8/1995 | Tihanyi | 257/401 |
| 5,473,180 A * | 12/1995 | Ludikhuize | 257/336 |
| 6,168,983 B1 * | 1/2001 | Rumennik et al. | 438/188 |
| 6,294,818 B1 * | 9/2001 | Fujihira | 257/409 |
| 6,452,231 B1 * | 9/2002 | Nakagawa et al. | 257/343 |

FOREIGN PATENT DOCUMENTS

| | | | |
|---|---|---|---|
| WO | WO9729518 | 8/1997 | H01L/29/78 |
| WO | 0033353 A2 | 6/2000 | |

OTHER PUBLICATIONS

"Silicon processing for the VLSI Era", by Stanley Wolf et al., pp. 155–156.

* cited by examiner

*Primary Examiner*—George Eckert
(74) *Attorney, Agent, or Firm*—Steven R. Biren

(57) ABSTRACT

A semiconductor body has source and drain regions (4 and 5) spaced apart by a body region (6) and both meeting a surface (3a) of the semiconductor body. A gate structure (7) is provided within a trench (8) for controlling a conduction channel in a conduction channel accommodation portion (60) of the body region (6) extending along at least side walls (8a) of the trench (8) and between the source and drain regions (4 and 5). A voltage-sustaining zone (600) consisting of first regions (6) of the same conductivity type as the source and drain regions interposed with second regions (62) of the opposite conductivity type is provided such that the first regions (61) provide a path for majority charge carriers to the drain region (5) when the device is conducting. The dopant concentrations and dimensions of the first and second regions (61 and 62) are such that, when the voltage-sustaining zone is depleted of free charge carriers in one mode of operation, the space charge per unit area in the first and second regions (61 and 62) balances at least to the extent that the electric field resulting from the space charge is less than the critical field strength at which avalanche breakdown would occur.

9 Claims, 1 Drawing Sheet

SEMICONDUCTOR DEVICE

This invention relates to a semiconductor device comprising a field effect device having a gate structure provided within a trench.

In particular, this invention relates to a semiconductor device comprising a semiconductor body comprising a field effect device wherein the semiconductor body has source and drain regions spaced apart by a body region and both meeting a surface of the semiconductor body, the field effect device having a gate structure provided within a trench for controlling a conduction channel in a conduction channel accommodation portion of the body region extending along at least the side walls of the trench and between the source and drain regions.

U.S. Pat. No. 4,835,584 describes such a trench transistor in which the source, gate and drain are formed within a trench in a semiconductor substrate. In this trench transistor, the gate width (where, as is understood in the art, the gate width is the dimension perpendicular to the flow of majority charge carriers through a conduction channel in the conduction channel accommodation portion and the gate length is the dimension parallel to the flow of majority charge carriers through the conduction channel) is determined by the depth of the trench and can be increased substantially without increasing the surface area occupied by the transistor, thereby enabling the device to have a good conduction channel width to length ratio and so a low on-resistance (Rdson) and good current handling capabilities or gain, without occupying an overly large area of semiconductor. However, the trench transistor proposed in U.S. Pat. No. 4,835,584 is not capable of withstanding high voltages between the source and drain regions when the device is non-conducting.

It is an aim of the present invention to provide a lateral field effect device having a trench gate structure which, in addition to having a low on-resistance, also has good reverse voltage withstanding characteristics.

In one aspect, the present invention provides a semiconductor device as set out in claim 1.

In one aspect, the present invention provides a lateral field effect device having a gate structure extending within a trench which is elongate in a direction between source and drain regions of the field effect device and wherein the trench extends from the source region and terminates in a voltage sustaining zone consisting of first regions of one conductivity type interposed with second regions of the opposite conductivity type with the dopant concentration and the dimensions of the first and second regions being such that, when the zone is depleted of free charge carriers in a mode of operation, the space charge per unit area in the first and second regions balances at least to the extent that the electric field resulting from the space charge is less than the critical field strength at which avalanche breakdown would occur. The gate structure may be an insulated gate structure and a plurality of parallel elongate trenches each containing an insulated gate structure may be provided. In an embodiment, the interposed first and second regions are elongate in a direction parallel to the direction in which the trench is elongate.

In one aspect, the present invention provides a semiconductor device comprising a semiconductor body comprising a field effect device, the semiconductor body having source and drain regions spaced apart in a first direction by a body region and both meeting a surface of the semiconductor body, the field effect device having a plurality of gate structures extending parallel to one another in a second direction perpendicular to said first direction in respective trenches for controlling a conduction channel in conduction channel accommodation portions of the body region extending along at least side walls of the trenches, each gate structure being elongate in said first direction and having first and second ends with the first end being surrounded by the source region, the field effect device having a voltage sustaining zone comprising first regions of one conductivity type interposed with second regions of the opposite conductivity type with the dopant concentrations and dimensions of the first and second regions being such that, when the zone is depleted of free charge carriers in a mode of operation, the space charge per unit area in the first and second regions balances at least to the extent that the electric field resulting from the space charge is less than the critical field strength at which avalanche breakdown would occur, each of the first and second regions being elongate in said first direction such that each first region extends between a conduction channel accommodation portion and the drain region and each second region extends between a portion of the body region spaced from the conduction channel accommodation portions and the drain region.

In one aspect, the present invention provides a semiconductor device comprising a semiconductor body comprising a field effect device, the semiconductor body having source and drain regions spaced apart in a first direction by a body region and both meeting a surface of the semiconductor body, the field effect device having a plurality of gate structures extending parallel to one another in a second direction perpendicular to said first direction for controlling a conduction channel in conduction channel accommodation portions of the body region each gate structure being elongate in said first direction and having first and second ends with the first end adjoining the source region, the field effect device having a voltage sustaining zone comprising first regions of one conductivity type interposed with second regions of the opposite conductivity type with the dopant concentrations and dimensions of the first and second regions being such that, when the zone is depleted of free charge carriers in a mode of operation, the space charge per unit area in the first and second regions balances at least to the extent that the electric field resulting from the space charge is less than the critical field strength at which avalanche breakdown would occur, each of the first and second regions being elongate in said first direction such that each first region extends between a conduction channel accommodation portion and the drain region and each second region extends between a portion of the body region spaced from the conduction channel accommodation portions and the drain region.

In an embodiment the gate structures are insulated gate structures.

A semiconductor device embodying the invention enables a lateral trench field effect device to be provided that has good current carrying capabilities and low on-resistance whilst also enabling relatively high voltages between the source and drain region to be withstood when the field effect device is non-conducting.

It should be noted that U.S. Pat. No. 4,754,310 (our reference PHB32740) describes a semiconductor device having a voltage sustaining zone formed of first regions of one conductivity type interposed with second regions of the opposite conductivity type with the dopant concentrations and dimensions of the first and second regions being such that, in a mode of operation when the zone is depleted of free charge carriers, the space charge per unit area in the first and second regions balances at least to the extent that the electric field resulting from the space charge is less than the critical field strength at which avalanche breakdown would occur.

Other advantageous technical features in accordance with the present invention are set out in the appended dependent claims.

Embodiments of the present invention will now be described, by way of example, with reference to the accompanying diagrammatic drawings in which.

It should be noted that the Figures are diagrammatic with relative dimensions and proportions of parts having been shown exaggerated or reduced in size for the sake of clarity and convenience. The same reference signs are generally used to refer to corresponding or similar features in the different embodiments.

Figure 1:
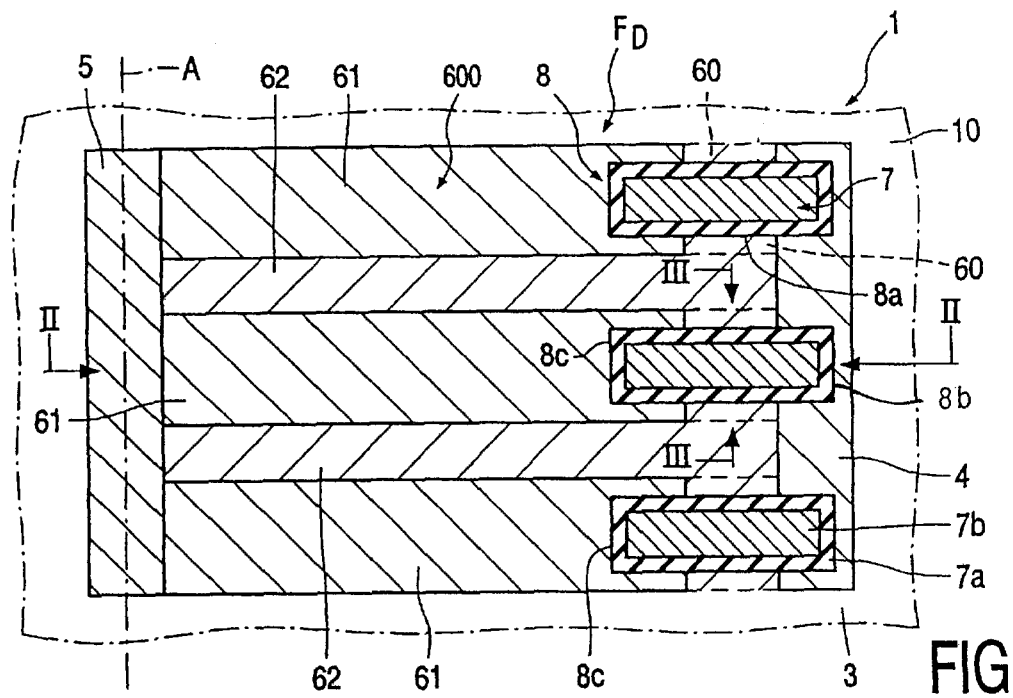
FIG. 1 shows a top plan view (with metallisation removed) of a first embodiment of semiconductor device in accordance with the present invention.
Figure 2:
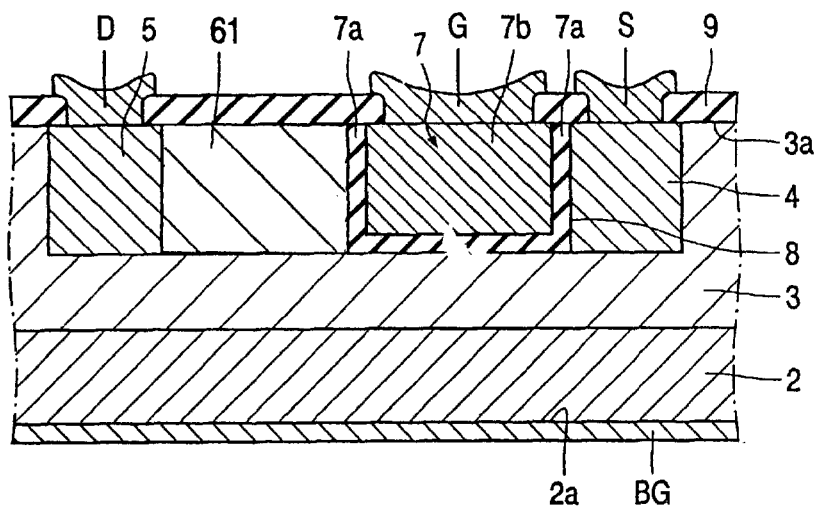
FIG. 2 shows a cross-sectional view taken along the line II—II in FIG. 1.
Figure 3:
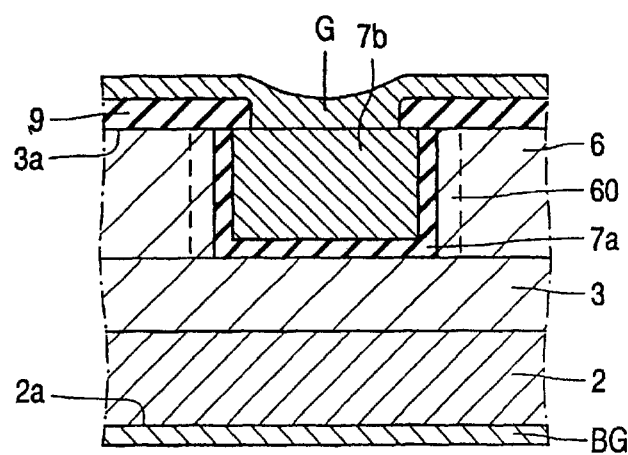
FIG. 3 shows a cross-sectional view taken along the line III—III in FIG. 1.

FIGS. 1 to 3 illustrate a first embodiment of a semiconductor device 1 in accordance with the invention. FIG. 1 shows a top plan view (with metallisation omitted) while FIGS. 2 and 3 show cross-sectional views taken along the lines II—III and III—III in FIG. 1.

The semiconductor device 1 comprises a semiconductor body 10 comprising a field effect device FD. In this embodiment the semiconductor body 10 comprises a silicon substrate 2 that is relatively highly doped with p conductivity type impurities and a silicon epitaxial layer 3 which is relatively lowly doped with p conductivity type impurities, typically boron.

The semiconductor body has n conductivity type source and drain regions 4 and 5 spaced apart by a p conductivity type body region 6 and both is meeting a surface 3a of the semiconductor body. The field effect device FD has a gate structure 7 provided within a trench 8 for controlling a conduction channel in a conduction channel accommodation portion 60 of the body region 6 extending along at least side walls 8a of the trench 8 and between the source and drain regions 4 and 5. Typically, the source and drain regions 4 and 5 will have dopant concentrations in the range of from $1 \times 10^{19}$ cm$^{-3}$ to $1 \times 10^{21}$ cm$^{-3}$ and a depth of, for example, 2 to 4 micrometers. Typically, the body region 6 will have a dopant concentration of from $1 \times 10^{16}$ cm$^{-3}$ to $2 \times 10^{17}$ cm$^{-3}$ and a depth greater than that of the source region but of similar order.

A voltage sustaining zone 600 extends from the channel accommodation portion 60 to the drain region 5. The voltage-sustaining zone comprises first regions 61 of n conductivity type interposed with second regions 62 of p conductivity type with each region 61 and 62 being elongate in a direction extending from the channel accommodation portion 60 to the drain region 5. The dopant concentration and dimensions of the first and second regions 61 and 62 are such that, when the voltage sustaining zone is depleted of free charge carriers when a voltage is applied between the source and drain regions 4 and 5, but the field effect device ED is non-conducting, the space charge per unit area in the first and second regions 61 and 62 balances at least to the extent that the electric field resulting from the space charge is less than the critical field strength at which avalanche breakdown would occur. For silicon then the product of the dopant concentration N and thickness d of a layer 61 or 62 should be approximately $2 \times 10^{12}$ cm$^{-2}$ for full depletion. This enables, as set out in U.S. Pat. No. 4,574,310 (our reference PHB32740), the individual first and second regions 61 and 62 to have a higher dopant concentration than would be the case if the voltage sustaining zone was formed of material of a single conductivity type, so allowing the same reverse voltage withstanding from approximately 2 micrometers to approximately 100 micrometers. The voltage-sustaining zone 600 and the trench gate structure together enable a field effect device to be obtained which occupies relatively little surface area yet has good current handling capabilities, low on-resistance and is capable of sustaining relatively high voltages, for example, reverse-biasing voltages in the range of 50 to 300 volts between the source and drain regions 4 and 5.

As shown in FIG. 1, the field effect device FD has a plurality of gate structures 7 extending parallel to one another in respective trenches 8. Although only three gate structures 7 are shown in FIG. 1 it will, of course, be appreciated that the field effect device FD may comprise one, two or many more gate structures arranged in parallel with one another. Providing a plurality of such parallel insulated gate structures 7 enables a greater current handling capability.

The gate structures 7 share a common source region 4 and a common drain region 5. As can be seen most clearly in FIG. 1, the source region 4 surrounds an end wall 8b and adjoining parts of the side walls 8a of the trench. This ensures good connection between the conduction channel in the channel accommodation portion 60 and the source region 4 when the device is conducting.

As shown in FIG. 1, each of the gate structures 7 comprises an insulated gate structure with a gate dielectric layer 7a being provided on the walls of the trench 8 and a gate conductive region 7b, typically formed of doped polycrystalline silicon, formed on the gate dielectric layer 7a. Typically, the gate dielectric layer 7a will be a thermal silicon oxide layer.

In the example shown in FIG. 1, the trenches 8 have a right parallelopipedal form and the conductive gate regions 7b substantially fill the trenches 8 so as to provide a planar surface 3a. As shown, each of the gate structures 7 is elongate in the direction between the source and drain regions 4 and 5.

The other end wall 8c of each trench 8 is surrounded by part of a corresponding first region 61 so that the regions 61 form the drain drift region of the field effect device providing a conductive path for majority charge carriers to the drain region 5.

Each of the p conductivity second regions 62 extends from the source region 4 to the drain region 5 and adjoins the adjacent conduction channel accommodation portion(s) 60.

As mentioned above, the surface metallisation has been omitted from FIG. 1 so as to enable the underlying structure be seen. The surface metallisation is, however, shown in FIGS. 2 and 3. As can be seen from these Figures a dielectric layer 9 is provided on the surface 3a having windows over the source and drain regions 4 and 5 and the gate structures 7. Metallisation is deposited and patterned to define a source electrode S which, although not shown, makes ohmic contact with substantially all of the area of the source region 4 exposed at the surface 3a and a drain electrode D which, although not shown, makes ohmic contact with substantially all of the area of the drain region 5 exposed at the surface 3a. As shown by FIGS. 2 and 3, the metallisation forming the gate electrode G contacts substantially all of the exposed surface of a gate conductive region 7b and extends from one gate conductive region 7b to the next over the dielectric layer 9 so that the gate conductive regions 7b are connected in a series.

The patterning of the metallisation is, of course, such as to achieve a well-defined separation between the source and gate electrodes S and G.

As shown in FIGS. 2 and 3, a back gate electrode BG may be provided on the exposed surface 2a of the substrate 2. As another possibility, a separate back gate electrode may be provided at the surface 3a by providing, in known manner, a contact region outside the device area and extending through the epitaxial layer 3 to the substrate.

The field effect device FD shown in FIGS. 1 to 3 may be manufactured by introduction of dopants into the epitaxial layer 3 so as to form the source, drain, first and second regions 4, 5, 61 and 62. After this the trenches 8 may be produced by a conventional anisotropic etching technique using a suitable mask, after which the gate dielectric 7a may be thermally grown in the trenches 8 and then doped polycrystalline silicon deposited to form the gate conductive regions 7b. After this the dielectric layer 9 may be deposited and patterned using conventional photolithographic and etching techniques and then metallisation deposited and patterned to form the source, drain and gate electrodes. Metallisation may then be provided on the surface 2a to form the back gate electrode BG.

As another possibility the field effect device may be manufactured by first of all etching away the area of the epitaxial layer 3 in which the field effect device FD is to be formed using conventional anisotropic etching techniques and then using selective epitaxial deposition of silicon as described at, for example, pages 155 and 156 of the text book entitled "Silicon processing for the VLSI Era volume 1: process technology" by Stanley Wolf PhD and Richard N. Tauber PhD published by Lattice Press in 1986 (ISBN 0-961672-3-7). The gate structures may then be formed by anisotropically etching the trenches 8 through the selective epitaxial material. Epitaxial refill of etched trenches is also described in U.S. Pat. Nos. 4,754,310, 5,438,215 and WO-A-97/29518.

In practice doping, generally by implantation, of the epitaxial layer 3 will be used to form the device for structures of 4 to 5 micrometers or less, for example the p conductivity type regions 62 may be formed by implanting boron or by using BSG (boronsilicate glass). For 5 micrometers or more then it is more attractive to etch the epitaxial layer and to refill with polycrystalline silicon to form the regions 61 and 62.

In the above described examples, the field effect device is provided on a silicon substrate. This need, however, not necessarily be the case and, for example, the field effect device may be provided on an insulating layer to provide a silicon on insulator type device.

Furthermore, in the embodiment described above, the field effect device has a stripe-like geometry with the source and drain regions being elongate and rectangular when viewed in plan and the gate structures also being elongate and rectangular when viewed in plan. However, other geometries could be adopted.

Also, the field effect device shown in FIG. 1 consists of a single elongate source and corresponding elongate drain region. It will, however, be appreciated that the field effect device shown in FIG. 1 may be modified so as to be symmetrical about the axis labeled A in FIG. 1. Furthermore, the structure shown in FIG. 1 may represent a unit cell that is repeated one or more times on the same semiconductor body.

In the embodiments described above, the conduction channel accommodation portions 60 are provided along side walls of the trenches. The conduction channel accommodation portions may also be provided beneath the bottom of the trenches.

In the embodiments described above, the gate structures are provided within trenches. The present invention may also be applied to mesa structure devices where the field effect device forms a mesa on a substrate and the gate structure extends over the side walls and a top surface of a body portion of the mesa structure between the source region and the voltage sustaining zone.

In the above described embodiments, the interposed first and second regions 61 and 62 are arranged to extend side by side in the direction of the line A in FIG. 1. The first and second interposed regions 61 and 62 may, however, also be placed one on top of the other, that is interposed in a direction perpendicular to line A and to the direction between the source and drain regions 4 and 5, provided that the first regions 61 are still arranged so as to provide a conductive path for majority charge carriers to the drain region 5.

The field effect device FD shown in FIG. 1 may, although not shown, be provided with suitable edge termination as will be understood by the person skilled in the art.

It will of course, be appreciated that the present invention may also be applied where the conductivity types given above are reversed and that semiconductor material other than silicon may be used such as germanium or germanium silicon alloys.

Also, the field effect transistor described above is a normally off or enhancement mode device. However, the present invention may be applied to normally on or depletion mode devices, in which case at least the part of the body region defining the channel accommodation portion will be of the same conductivity type as the source and drain regions 4 and 5. The present invention may also be applicable to MESFETs as well as to insulated gate field effect devices. In addition the field effect device may be, for example, an insulated gate bipolar transistor where the drain region is of the opposite conductivity type to the source region. The invention may also be applied to Schottky source devices.

In the above described embodiments, the gate structure extends from one end of the trench to the other. This need not be the case.

FIG. 1 illustrates a uniform thickness for the gate dielectric layer 7a where it extends from the channel area to the source region 4. However, in order to reduce the gate-source capacitance, a greater thickness for the gate dielectric layer 7a (and/or even a different dielectric material) may be used where the gate structure 7a and 7b is bounded by the source region 4.

As described above, the gate conductive region 7b substantially fills the trench providing the advantage of providing a planar surface. However, in some circumstances the conductive gate region need not substantially fill the trench but could be a relatively thin layer following the trench contour as described in U.S. Pat. No. 4,835,584.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during prosecution of the present application or of any further application derived therefrom.

What is claimed is:

1. A trench-gate field-effect semiconductor device having a semiconductor body, comprising:

source and drain regions of one conductivity type in contact with a surface of the semiconductor body and spaced apart in a first direction by a body region of an opposite conductivity type and a voltage sustaining zone;

a plurality of gate structures in respective trenches extending parallel to one another in a second direction perpendicular to said first direction for controlling a conduction channel in channel-accommodation portions of the body region extending along at least parallel side walls of each trench;

each gate structure substantially filling its respective trench and being elongate in said first direction between first and second ends of its respective trench, the trench extending through the body region from the source region at a first end to terminate in the voltage sustaining zone at its second end;

wherein the voltage sustaining zone comprises a side-by-side arrangement of first regions of the one conductivity type interposed with second regions of the opposite conductivity type in the second direction, both the first and second regions meeting the surface of the semiconductor body and being elongate in said first direction between the body region and the drain region;

the respective trenches of the gate structures terminating with their second ends in first regions of the voltage sustaining zone that provide a path for majority charge carriers of the one conductivity type from the channel-accommodation portions of the body region to the drain region when the field-effect device is conducting, the second regions extending from portions of the body region beside the channel-accommodation portions to the drain region; and the dopant concentrations and dimensions of the first and second regions are such that when the zone is depleted of free charge carriers in a non-conducting mode of operation the space charge per unit area in the first and second regions balances at least to the extent that the electric field resulting from the space charge is less than the critical field strength at which avalanche breakdown would occur.

2. A semiconductor device according to claim 1, wherein each trench has its first end at least partially surrounded by the source region.

3. A semiconductor device according to claim 2, wherein the second ends of the trenches are at least partially surrounded by said first regions that provide the path for majority charge carriers.

4. A semiconductor device according to claim 2, wherein the gate structures share a common source region.

5. A device according to claim 1, wherein each gate structure is an insulated gate defined by a dielectric layer provided on the walls of the trench and a conductive region provided on the dielectric layer in the trench.

6. A semiconductor device according to claim 1, wherein the body region has a depth greater than the source region.

7. A semiconductor device according to claim 1, wherein the channel-accommodation portions of the body region extend beneath the bottom of their respective trench from the parallel side walls of the trench.

8. A semiconductor device according to claim 1, wherein the semiconductor body comprises an epitaxial layer of the opposite conductivity type on a more highly doped substrate of the opposite conductivity type, and wherein the source and drain regions, the body region, the trenches and the voltage sustaining zone are provided in the epitaxial layer.

9. A semiconductor device according to claim 8, wherein a back gate electrode is connected to the highly doped substrate.

* * * * *